US006397374B1

(12) United States Patent
Pasqualini

(10) Patent No.: US 6,397,374 B1
(45) Date of Patent: *May 28, 2002

(54) ZERO HOLD TIME CIRCUIT FOR HIGH SPEED BUS APPLICATIONS

(75) Inventor: Ronald Pasqualini, Los Altos, CA (US)

(73) Assignee: National Semiconductor Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/164,218

(22) Filed: Sep. 30, 1998

(51) Int. Cl.$^7$ ........................ G06F 17/50; H03K 19/173
(52) U.S. Cl. ................................ 716/8; 716/6; 326/49
(58) Field of Search ............................ 716/8, 6; 326/49

(56) References Cited

U.S. PATENT DOCUMENTS

| | | | | |
|---|---|---|---|---|
| 4,016,511 A | | 4/1977 | Ramsey et al. ................ 333/29 |
| 4,845,675 A | * | 7/1989 | Krenik et al. ................ 365/203 |
| 5,133,069 A | * | 7/1992 | Asato et al. ................ 395/800 |
| 5,212,782 A | * | 5/1993 | Asato et al. ................ 395/500 |
| 5,274,568 A | * | 12/1993 | Blinne et al. ................ 364/489 |
| 5,495,487 A | * | 2/1996 | Whetsel, Jr. ................ 371/25.1 |
| 5,495,596 A | * | 2/1996 | Yau ............................. 395/550 |
| 5,623,645 A | * | 4/1997 | Yip et al. ..................... 395/551 |
| 5,631,911 A | * | 5/1997 | Whetsel, Jr. ................ 371/22.3 |
| 5,649,175 A | * | 7/1997 | Kanekal et al. .............. 395/551 |
| 5,666,288 A | * | 9/1997 | Jones et al. .................. 364/490 |
| 5,841,296 A | * | 11/1998 | Churcher et al. .............. 326/49 |
| 5,896,299 A | * | 4/1999 | Ginetti et al. ................ 364/490 |
| 5,963,069 A | * | 10/1999 | Jefferson et al. ............. 327/158 |
| 5,999,032 A | * | 12/1999 | Wang et al. ................. 327/292 |
| 6,034,544 A | * | 3/2000 | Agrawal et al. ............... 326/39 |
| 6,034,548 A | * | 3/2000 | Churcher et al. .............. 326/49 |
| 6,058,496 A | * | 5/2000 | Gillis et al. ................. 714/727 |
| 6,081,916 A | * | 6/2000 | Whetsel, Jr. ................ 714/727 |
| 6,133,751 A | * | 10/2000 | Churcher et al. .............. 326/49 |

OTHER PUBLICATIONS

M. Iwabuchi et al., A Methodology to Analyze Power, Voltage Drop, and their Effects on Clock Skew/Delay in Early Stages of Design, Proceedings of 1999 Symposium on Physical Design, pp. 9–15, Apr. 1999.*
S. Trimberger et al., Architecture Issues and Solutions for a High–Capacity FPGA, Proceedings of the 1997 ACM 5th Int. Symposium on Field–programmable Gate Arrays, pp. 3–9, Feb. 1997.*
R. –S Tsay, An Exact Zero–skew Clock Routing Algorithm, IEEE Computer–Aided Design of Integrated Circuits, pp. 242–249, Feb. 1993.*
K.M. Carrig et al., A New Direction in ASIC high–performance Clock Method, IEEE Custom Integrated Circuits Conference, pp. 593–596, May 1998.*
J.L. Neves et al., Synthesizing Distributed Buffer Clock Trees for High Performance ASICs, Proceedings IEEE International ASIC Conference and Exhibit, pp. 126–129, Sep. 1994.*
Feng Lin et al., A Register Controlled Symmetrical DLL for Double–Data–Rate DRAM, IEEE Journal of Solid–State Circuits, pp. 565–568, Apr. 1999.*

* cited by examiner

*Primary Examiner*—Matthew Smith
*Assistant Examiner*—A. M. Thompson
(74) *Attorney, Agent, or Firm*—Pillsbury & Winthrop LLP

(57) ABSTRACT

A zero hold time data input cell is realized by employing a programmable data delay line containing a series of delay stages. Since each delay stage contributes only a fraction of the total data delay required, the rise/fall times of each data delay stage can be very fast, under all PVT (process/voltage/temperature) conditions. As a result, any amount of data delay can be provided at any data rate, while still allowing the delayed data waveform to make complete voltage excursions between the ground voltage and the power supply voltage. This capability prevents data dependent hold violations from occurring.

30 Claims, 10 Drawing Sheets

ZERO HOLD TIME CIRCUIT FOR HIGH SPEED BUS APPLICATIONS

1.0 FIELD OF THE INVENTION

The present invention relates to CMOS input cells and, more specifically, to the implementation of a zero hold time CMOS input cell which utilizes a programmable delay line. This input cell is suitable for use in many high speed data bus applications.

2.0 DESCRIPTION OF THE RELATED ART

An edge triggered D flip-flop (or D flop) is a well known device which captures the logic state of a data input signal on the rising (or falling) edge of a clock input signal. In practice, integrated circuits (ICs) commonly use D flops to capture input data from an external bus.

FIG. 1 shows a simplified circuit diagram which illustrates a portion of a conventional integrated circuit 100. As shown in FIG. 1, circuit 100 includes a D flop 110 which is located in the core of circuit 100, and an input data cell 112. Input data cell 112 includes an input data pin 116, which receives a data input signal DATA from an external data bus 118. Input data pin 116, in turn, supplies the DATA signal to a CMOS/TTL compatible data input buffer 114, whose output directly drives the D input of flop 110.

Similarly, circuit 100 also includes an input clock cell 120. Input clock cell 120 includes a clock input pin 124, which receives a clock input signal CLK from an external source. Clock input pin 124, in turn, supplies the CLK signal to a CMOS/TTL compatible clock input buffer 122, whose output directly drives the CLK input of flop 110.

As shown in FIG. 1, the DATA signal from external data bus 118 must be captured (i.e. latched) by flop 110. In order for this to occur, the specified minimum setup and hold times for flop 110 must be met. In general, these minimum setup and hold times can be positive, negative or zero. Because setup and hold times are signed numbers, they are, by convention, interpreted as follows. For a rising edge triggered flop, a positive setup time indicates that the data on the flop D pin must change state before the clock rises on the flop CLK pin. Conversely, a negative flop setup time allows the data on the flop D pin to change state after the clock rises on the flop CLK pin.

Similarly, for a rising edge triggered flop, a positive hold time indicates that the data on the flop D pin must change state after the clock rises on the flop CLK pin. Conversely, a negative flop hold time allows the data on the flop D pin to change state before the clock rises on the flop CLK pin.

For example, if the specified minimum setup time for flop 110 is +1 ns, flop 110 will capture the correct data if it is presented with a setup time of +1 ns, +2 ns or +3 ns. Flop 110 will not capture the correct data, however, if it is presented with a setup time of −1 ns, 0 ns or +0.5 ns.

Similarly, if the specified minimum hold time for flop 110 is −0.5 ns, flop 110 will capture the correct data if it is presented with a hold time of −0.5 ns, 0 ns or +1 ns. Flop 110 will not capture the correct data, however, if it is presented with a hold time of −3 ns, −2 ns or −1 ns.

From the foregoing examples, it can be seen that the specified minimum setup and hold times for flop 110 will be met if the following statement is true: the setup and hold times presented to flop 110 must be arithmetically greater than or equal to its specified minimum setup and hold times.

2.1 Zero Hold Time Bus Conditions

One of the problems associated with capturing data from a high speed synchronous data bus, such as the PCI bus, is that data can change state at exactly the same time that the clock rises (assuming a rising edge clock reference). Thus ICs which are connected to high speed synchronous data buses are often required to operate with zero hold time at their data bus input pins, relative to their clock input pin.

Referring to FIG. 1, in order to determine whether or not the minimum setup and hold requirements of flop 110 are being met, the following parameters must be examined: the relative timing of the input signals DATA and CLK, and the delays imposed by data input buffer 114 and clock input buffer 122. These parameters will be examined in the following paragraphs.

As shown in FIG. 1, the signal path to the D input of flop 110 goes through data input buffer 114, which has a relatively low fanout (only one in this PCI bus example). However, the signal path to the CLK input of flop 110 goes through clock input buffer 122, which has a relatively high fanout (49 in this PCI example). Due to this difference in fanout, the load capacitance on data input buffer 114 will be far less than the load capacitance on clock input buffer 122. This difference in load capacitance implies that the delay through data input buffer 114 will be far less than the delay through clock input buffer 122. (Note: In most high speed bus applications it is not possible to speed up the clock input buffer to the point where its delay is less than or equal to the delay through the data input buffer).

From the above discussion it can be seen that the delay from data input pin 116 to the D input of flop 110 will usually be less than the delay from clock input pin 124 to the CLK input of flop 110. Hence, when the clock and data signals have a zero hold time relationship at the chip input pins (i.e. on the bus), the hold time imposed on flop 110 can be highly negative, causing a hold time violation. This hold time violation can cause the wrong bus data to be captured, resulting in a system malfunction.

FIG. 2A shows a timing diagram which illustrates the hold time violation described in the preceding paragraph. In this example it is assumed that flop 110 in FIG. 1 has a specified minimum hold time of −0.5 ns. In accordance with the foregoing discussion, it is also assumed that the delay through data input buffer 114 in FIG. 1 is 1 ns, and that the delay through clock buffer 122 in FIG. 1 is 3 ns.

As shown by waveforms A and B in FIG. 2A, the input signals CLK and DATA both change state at exactly the same time (0 ns). Thus the correct data which must be captured by flop 110 in FIG. 1 is designated as 'D1' in FIG. 2A. However, because the delay through clock buffer 122 in FIG. 1 is 3 ns, the CLK pin of flop 110 will not go high until 3 ns, as shown by waveform C in FIG. 2A. Similarly, because the delay through data buffer 114 in FIG. 1 is only 1 ns, the D pin of flop 110 will change state at 1 ns, as shown by waveform D in FIG. 2A. Thus, when comparing waveforms C and D in FIG. 2A, it can be seen that the hold time presented to flop 110 is equal to −2 ns. Since the minimum hold time for flop 110 is −0.5 ns, flop 110 has a hold violation of 1.5 ns (absolute value). Thus flop 110 will not capture the correct data 'D1'; it will instead capture the wrong data 'D2'.

The above hold time violation can be corrected by modifying the circuit shown in FIG. 1. Referring to FIG. 3, circuit 300 is similar to circuit 100 shown in FIG. 1, and, as a result, uses the same reference numerals to designate structures which are common to both circuits.

The circuit shown in FIG. 3 illustrates a portion of a conventional integrated circuit 300. As shown in FIG. 3, the hold time violation for flop 110 can be corrected by adding a delay circuit 310 to input data cell 112. Thus, as shown by the waveforms in FIG. 2B, if the added delay is equal to at least 1.5 ns, the hold time violation for flop 110 will disappear (i.e. the imposed hold time will increase from −2 ns to −0.5 ns).

Referring to FIG. 3, if the added delay 310 is too short, the zero hold time requirement will not be met. Conversely, if the added delay is too long, the flop hold time will be more than sufficient, but the flop setup time may be decreased to the point where a setup violation occurs. (This assumes that the clock period, $t_{CLK}$, and the maximum logic chain delay, $t_{LOGIC}$, do not change—i.e. $t_{CLK}=t_{SETUP}+t_{HOLD}+t_{LOGIC}$, thus $t_{SETUP}=t_{CLK}-t_{LOGIC}-t_{HOLD}$).

Referring to FIG. 3, if data input pin 116 and clock input pin 124 have a zero hold time relationship, the minimum delay required to prevent a hold time violation at flop 110 must satisfy EQ. 1:

$$t_{IB}+t_{310}-t_{CLK} \geq t_{HOLD} \qquad \text{EQ. 1}$$

where $t_{IB}$ represents the propagation delay through data input buffer 114, $t_{310}$ represents the minimum required propagation delay through delay circuit 310, $t_{CLK}$ represents the propagation delay through clock input buffer 122, and $t_{HOLD}$ represents the minimum hold time required by flop 110.

EQ. 1 can be solved for $t_{310}$, the minimum required propagation delay through delay circuit 310, as follows:

$$t_{310} \geq t_{HOLD}+t_{CLK}-T_{IB} \qquad \text{EQ. 2}$$

As shown in EQ. 2, for the special case where the required flop hold time $t_{HOLD}$ is equal to zero, the added data delay $t_{310}$ must be greater than or equal to the clock buffer delay $t_{CLK}$ minus the data input buffer delay $t_{IB}$.

Referring to FIG. 1, conventional integrated circuits, such as circuit 100, can include wide synchronous data busses 118 containing up to 128 data bits. These wide data buses must drive many input data buffers 114 which, in turn, must drive many input data flops 110. Since the input data flops are usually located in the core, different input data flops can be located at different wire distances from their associated input data buffers. These varying wire distances can cause differences in the load capacitances presented to each input data buffer, resulting in data delay differences to each input data flop. These data delay differences, in turn, can cause some input data flops to have inadequate hold time. In order to prevent this from happening, a data delay and a data latch can be employed, as shown in FIG. 4.

FIG. 4 illustrates a portion of a conventional integrated circuit 400. Circuit 400 is similar to circuit 300 and, as a result, utilizes the same reference numerals to designate the structures which are common to both circuits.

As shown in FIG. 4, circuit 400 differs from circuit 300 in that input data cell 112 of circuit 400 includes a delay latch 410 which is connected between delay circuit 310 and flop 110. Delay latch 410 differs from flop 110 in that it is level triggered rather than edge triggered. Thus latch 410 passes the logic state on its data input pin D to its data output pin Q, while the clock is low. Conversely, latch 410 holds (i.e. latches) the logic state on its data input pin D at its data output pin Q, when the clock goes high.

During normal operation, latch 410 simply retains the 'old' data, which was valid before the rising clock edge, before it is destroyed by the 'new' data, which is valid after the rising clock edge. Thus the data output Q of latch 410 is retained for an entire clock cycle.

Referring to FIG. 4, the main advantage of including delay latch 410 inside input data cell 112 is that it allows the required data delay 310 to be minimized. This increases the maximum allowable operating frequency. Thus, when CLK and DATA have a zero hold time relationship at the IC clock/data pins, and delay latch 410 is included inside input data cell 112, delay circuit 310 only needs to compensate for the difference in clock/data delay through clock buffer 122 and input buffer 114. Delay circuit 310 does not have to compensate for data delay differences caused by varying wire lengths to different data flops 110 located in the core.

Referring to FIG. 4, in most applications the amount of delay provided by delay circuit 310 can be made the same for all data input cells 112. However, in very high speed bus applications (where the relative clock/data arrival times significantly vary from one data input cell 112 to the next), delay 310 may have to be adjusted on a cell-by-cell basis.

2.2 Factors Affecting the Amount of Data Delay Required

Circuits 100, 300, and 400 assume that the on-chip clock is being generated by a clock input buffer which is directly driven from the bus clock pin. However, for large complex chips, this 'flat' clock buffer approach is often impractical. Thus on-chip clocks are often generated by multi-stage, hierarchical clock trees. A simple example of a multi-stage, hierarchical clock tree 600 is shown in FIG. 5.

Hierarchical clock trees usually produce smaller clock skew—ideally zero, allowing a higher maximum operating frequency. However, although the hierarchical clock tree approach minimizes clock skew, it accomplishes this at the expense of increased clock latency (clock delay). As shown in FIG. 5, this additional latency occurs because the clock signal must pass through additional logic levels before it finally reaches the clock input of an internal data flop.

Since the hierarchical clock tree approach increases clock delay, it also requires a corresponding increase in data delay, so that the zero hold time constraint present at the IC clock/data pins can be met. As explained below, a major problem with prior art delay circuits is that they often cannot provide this extra data delay without introducing data errors.

2.3 Description of Prior Art Delay Circuits

FIG. 6 illustrates a conventional delay stage 700 which can be used to implement delay circuit 310. Delay stage 700 delays the data signal, as required, by utilizing RC (resistor/capacitor) values which slow down the rise/fall times of the data signal. Thus, when a moderate to large data delay is needed, the rise/fall times produced by the RC stage will be slow.

Since delay circuit 700 slows down the rise/fall times of the data signal, at least one non-inverting logic buffer is often required in order to 'square up' (i.e. speed up) the slow edge rates. As shown in FIG. 6, a non-inverting delay circuit is implemented by utilizing an RC delay stage followed by buffer inverters 710 and 720.

FIG. 7 shows a circuit diagram which illustrates another conventional delay stage 800 which can be utilized to implement delay circuit 310. As shown in FIG. 7, delay stage 800 utilizes a high impedance CMOS inverter stage 810 and a load capacitance C which is connected to stage 810.

Delay stage 800 is somewhat superior to delay stage 700 because the CMOS inverter stage 810 effectively creates timing resistors which are more closely correlated to the process/voltage/temperature (PVT) variations which can occur. Nevertheless, when a moderate to large data delay is required, the rise/fall times produced by CMOS inverter stage 810 will also be slow. As a result, one or more buffers are needed in order to square up these slow edge rates. Thus, as shown in FIG. 7, a single non-inverting delay circuit has been implemented by employing inverters 810 and 811.

As described above, the single RC delay stage employed in the prior art produces slow edge rates in order to provide the data delay which is required. Even though these slow edge rates are eventually squared up, the single RC stage nevertheless imposes a serious limitation on the amount of data delay which can be obtained. This limitation is discussed in the following paragraphs.

2.4 Limitations of the Prior Art Delay Circuits

The data delay implementations discussed above suffer from the same critical limitation: the maximum delay which can be obtained is limited to only a small fraction of the minimum data period. (The minimum data period, or maximum data frequency, occurs when the data changes state as often as possible on the data bus).

The reason for the above timing limitation is that, at the highest data rate, the RC voltage waveform must have sufficient time to rise from 0V to a value close to VCC. Similarly, at the highest data rate, the RC voltage waveform must also have sufficient time to fall from VCC to a value close to 0V. If these two conditions are not met, the data delay will vary with the data rate. This delay variation will cause the provided setup and hold times to vary, resulting in circuit timing failures which are dependent upon the data rate.

For example, assuming VCC=5V, when the bus data changes state at a low data rate (i.e. infrequently), the delayed RC voltage waveform will have plenty of time to make rising/falling transitions between 0V and 5V. However, when the bus data changes state as often as possible, the RC voltage waveform may only be able to make transitions between 1.5V and 3.5V. Thus, when bus data transitions occur relatively infrequently, the data delay will be large. Conversely, when bus data transitions occur as often as possible, the data delay will be small. As stated in the preceding paragraphs, these data dependent delay variations can easily cause hold time and/or setup time violations to occur, resulting in circuit timing failures.

In the paragraphs which follow, it will be shown that, using the prior art delay circuits discussed above, the data delay will be limited to only a small fraction of the minimum data period. This limitation is required in order to insure that there is always sufficient time for the delayed data waveform to make full transitions between 0V and VCC.

2.5 Timing Limitations on the Data Delay Circuit (Using Prior Art)

FIG. 8 shows two data waveforms, waveform 910 and waveform 920. Waveform 910 is a delayed data waveform produced by an RC delay circuit similar to those discussed in the preceding paragraphs. Waveform 920 is a delayed ('squared up') version of waveform 910. As shown in FIG. 8, the delayed waveform 920 is retarded in time by an amount equal to $t_d$, where $t_d$ is the required data delay time.

It is assumed that the delayed waveform 920 in FIG. 8 has been squared up by logic gates whose 'trip points' are centered around VCC/2. Thus the phase relationship between waveform 910 and waveform 920 will be as shown in FIG. 8.

Waveform 910 and waveform 920 both have the same data period. Thus, in most timing-critical applications, it is sufficient to assume that this data period contains 6 RC time constants: 3 for the rising portion of waveform 910, and 3 for the falling portion of waveform 910. The voltage V for the rising portion of the RC waveform 910 is defined by EQ. 1:

$$V=VCC(1-e^{-t/\tau})\qquad\text{EQ. 1}$$

where VCC represents the power supply voltage, t represents time, and τ represents the RC time constant.

The delay time required for RC waveform 910 to go from zero volts to VCC/2 volts (or from VCC/2 volts to zero volts), is defined by EQ. 2:

$$VCC/2=VCC(1-e^{-td/\tau})\qquad\text{EQ. 2}$$

where $t_d$ represents the delay time.

Solving EQ. 2 for τ yields τ=$t_d$/0.693. Since $T_{MIN}$, which represents the minimum data period, is equal to 6τ, $T_{MIN}$ is defined by EQ. 3:

$$T_{MIN}=8.65t_d.\qquad\text{EQ. 3}$$

EQ. 3 indicates that the minimum data period $T_{MIN}$, and the required data delay $t_d$, are directly related by the simple equation: $T_{MIN}$=8.65$t_d$. To put it another way, the required data delay $t_d$ is limited to only 12% (1/8.65) of the minimum data period $T_{MIN}$.

The above limitation is an extremely serious one for high speed data buses. For example, a 50 Mhz data bus can change state as often as every 20 ns ($T_{MIN}$=20 ns). Thus the maximum allowable data delay, $t_d$, is equal to only 2.3 ns. If there is a zero hold time constraint at the IC clock/data pins, and a hierarchical clock tree is being used, the maximum clock latency must not exceed 2.3 ns, else a hold time violation will occur. In many IC applications the hierarchical clock tree latency can easily exceed 2.3 ns; thus the prior art circuitry cannot be used to generate an acceptable data delay. Of course, for a very fast 100 Mhz data rate ($T_{MIN}$=10 ns), the data delay problem gets even worse.

2.6 PVT Limitations on the Delay Circuit

For ICs operating under a zero hold time constraint at their clock/data pins, the minimum data delay required to guarantee correct circuit operation is usually determined under fast PVT (process/voltage/ temperature) conditions. Thus, if more than the minimum required data delay is provided at fast PVT, this additional (unneeded) data delay will be increased by approximately two to three times at slow PVT. This 2×–3× increase in data delay can make it extremely difficult to provide adequate setup time under slow PVT conditions. Thus, in most high speed data applications, it is extremely important to provide only the minimum amount of data delay required to barely meet the zero hold time constraint at fast PVT.

3.0 SUMMARY OF THE INVENTION

In order to meet the zero hold time constraint imposed at the clock/data pins of an IC, RC data delay circuits are conventionally employed. These RC data delay circuits are used to delay the incoming data signals received from an external data bus.

As described in the preceding paragraphs, the maximum data delay that can be obtained from a conventional RC data delay circuit is severely limited. This limitation exists because the delayed data signal must be allowed to rise to a voltage level close to VCC, and must be allowed to fall to a voltage level close to ground. These 'complete' voltage excursions between VCC and ground are required under all conditions, even when the bus data changes state at the highest possible frequency. Failure to make 'complete' voltage excursions between VCC and ground will result in data delays which vary with the data rate, causing hold time violations to occur.

The present invention solves the aforementioned problem by utilizing a series of data delay stages which provide the equivalent of a programmable data delay line. This programmable delay line provides the total data delay required to operate an IC under a zero hold time constraint at its clock/data pins.

Since each stage in the programmable delay line provides only a fraction of the total data delay required, the rise/fall time of each delay stage can be very fast. This allows the output voltage waveform of each delay stage to make 'complete' excursions between ground and VCC, assuring a data delay which is independent of the data rate. Thus, by choosing the appropriate number of delay stages to be employed, any amount of data delay can be obtained at any data rate.

An input data cell, in accordance with the present invention, contains a data pad and a data input buffer which is connected to the data pad. The data input buffer drives a delay circuit which, in turn, drives an optional delay latch. The delay latch drives logic flip-flops located in the IC core.

In the present invention, the delay circuit contains a plurality of delay stages which have a corresponding plurality of outputs. In operation, the delay provided by the delay circuit is "programmed" by selecting one of the delay circuit outputs and connecting it to the D input of an optional delay latch.

A better understanding of the features and advantages of the present invention will be obtained by reference to the following detailed description and accompanying drawings which set forth an illustrative embodiment in which the principals of the invention are utilized.

4.0 BRIEF DESCRIPTION OF THE DRAWINGS

Figure 8:
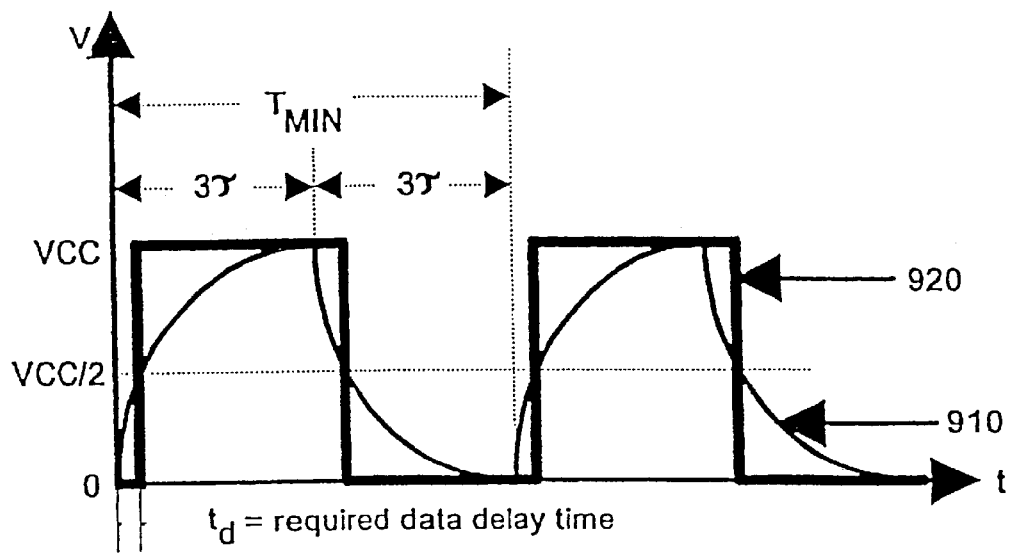

FIG. 8 is a waveform diagram illustrating an RC voltage waveform 910, and a squared up voltage waveform 920, that is a delayed version of waveform 910 .

Figure 9:
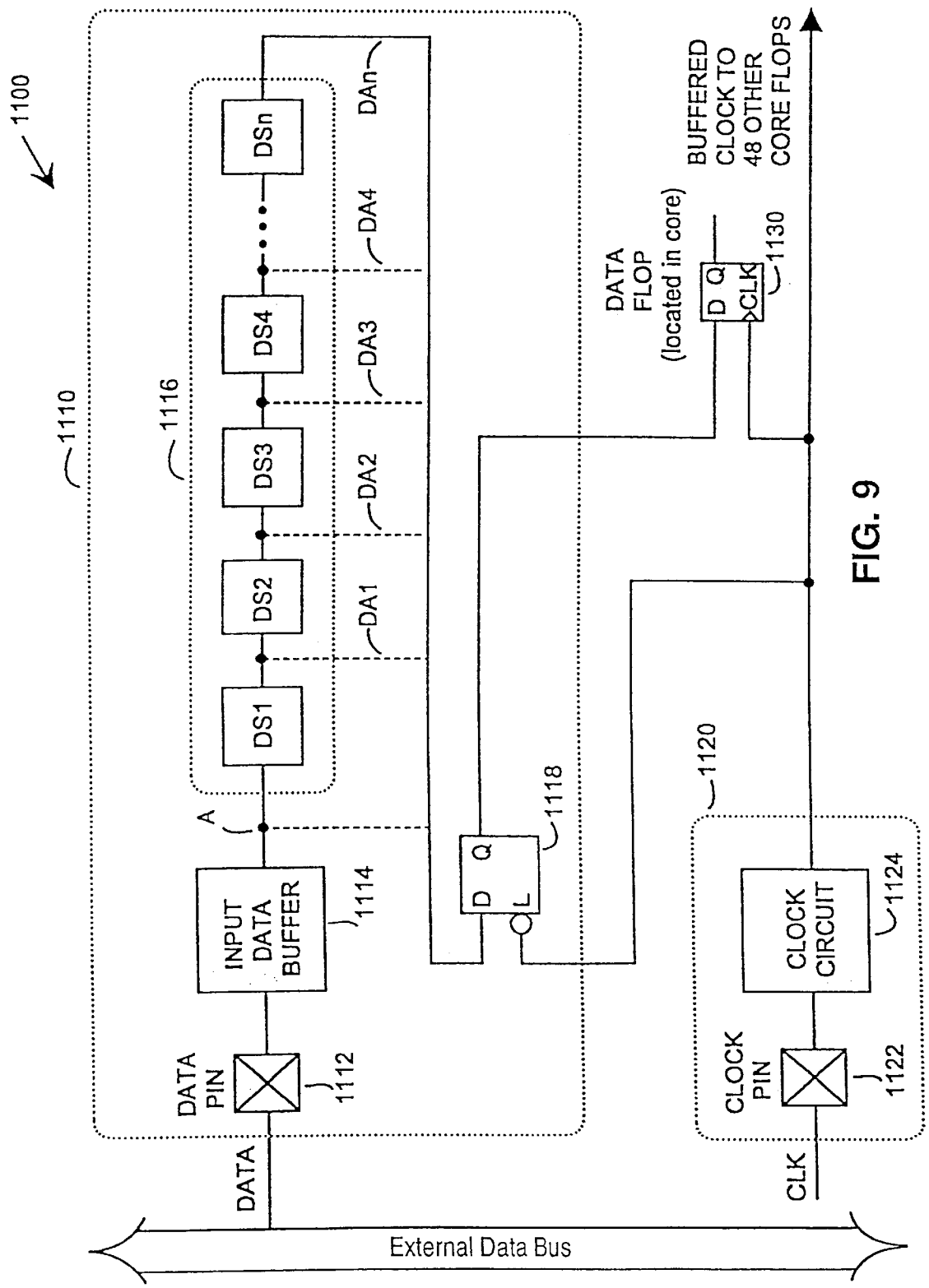

FIG. 9 is a circuit diagram illustrating a portion of an integrated circuit 1100 in accordance with the present invention.

Figure 10A:
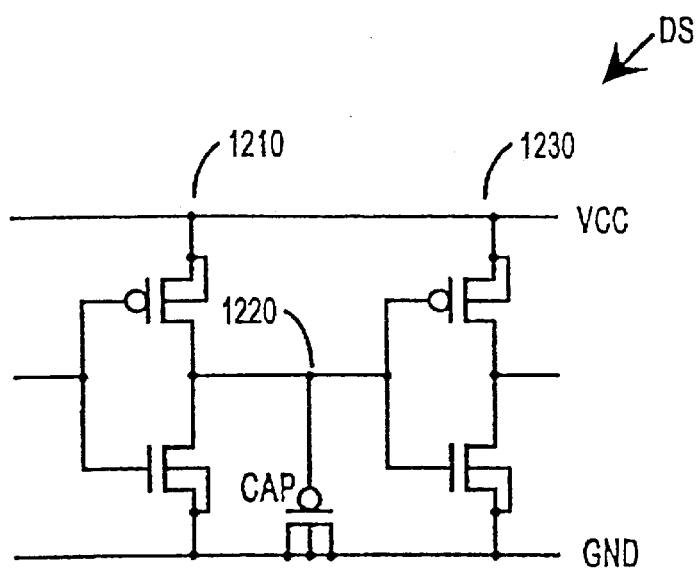
Figure 10B:
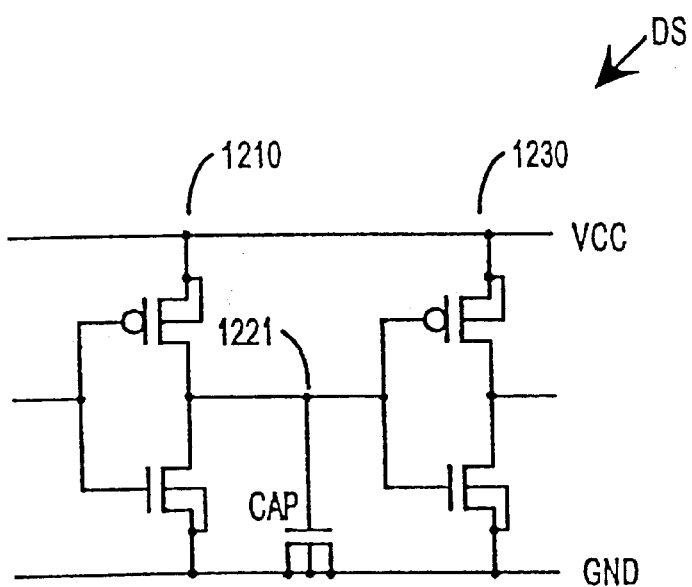

FIGS. 10A and 10B are circuit diagrams illustrating a delay stage DS in accordance with the present invention.

Figure 11:
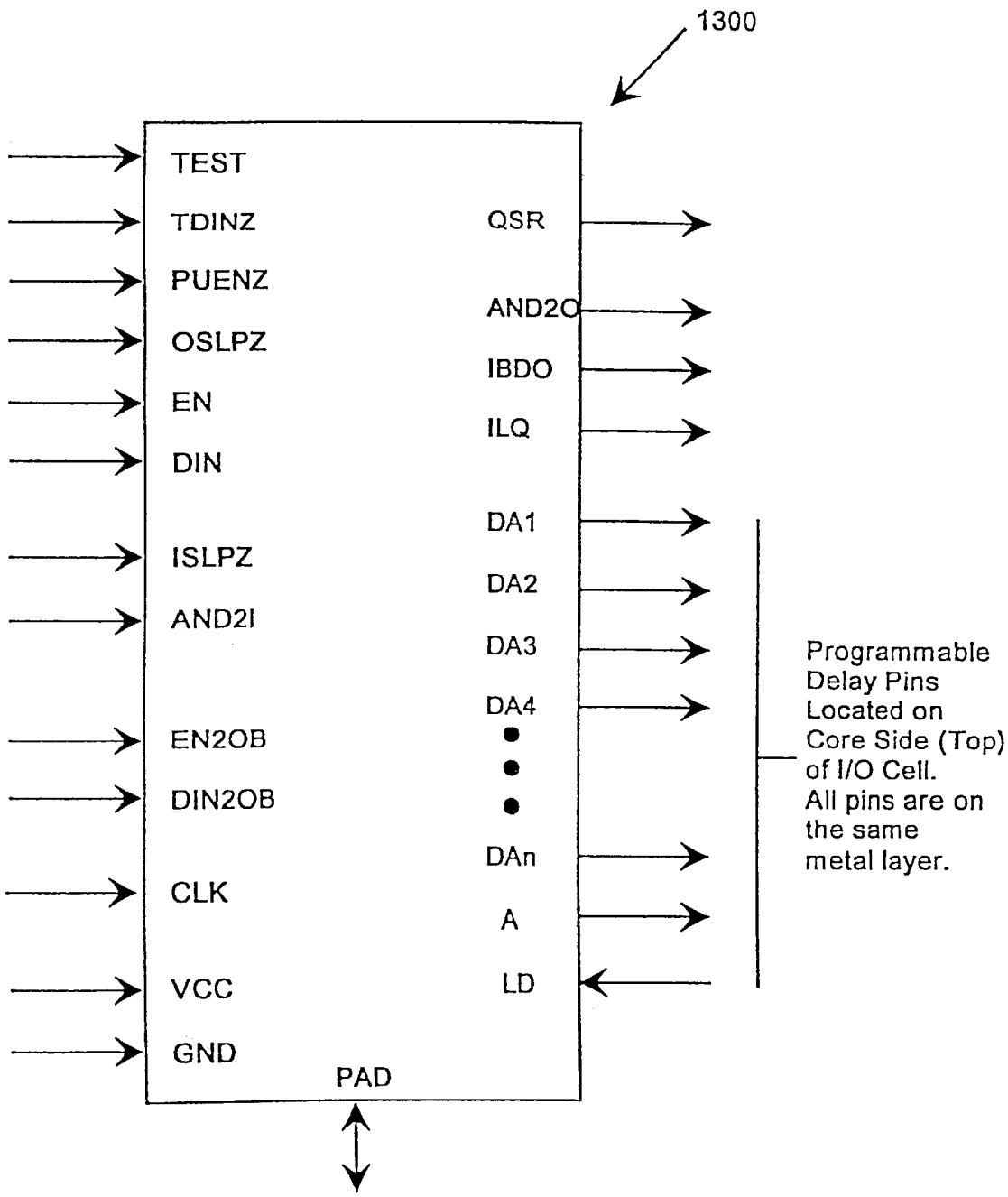

FIG. 11 is a top level symbol (view) illustrating an I/O cell 1300 in accordance with the present invention.

Figure 12:
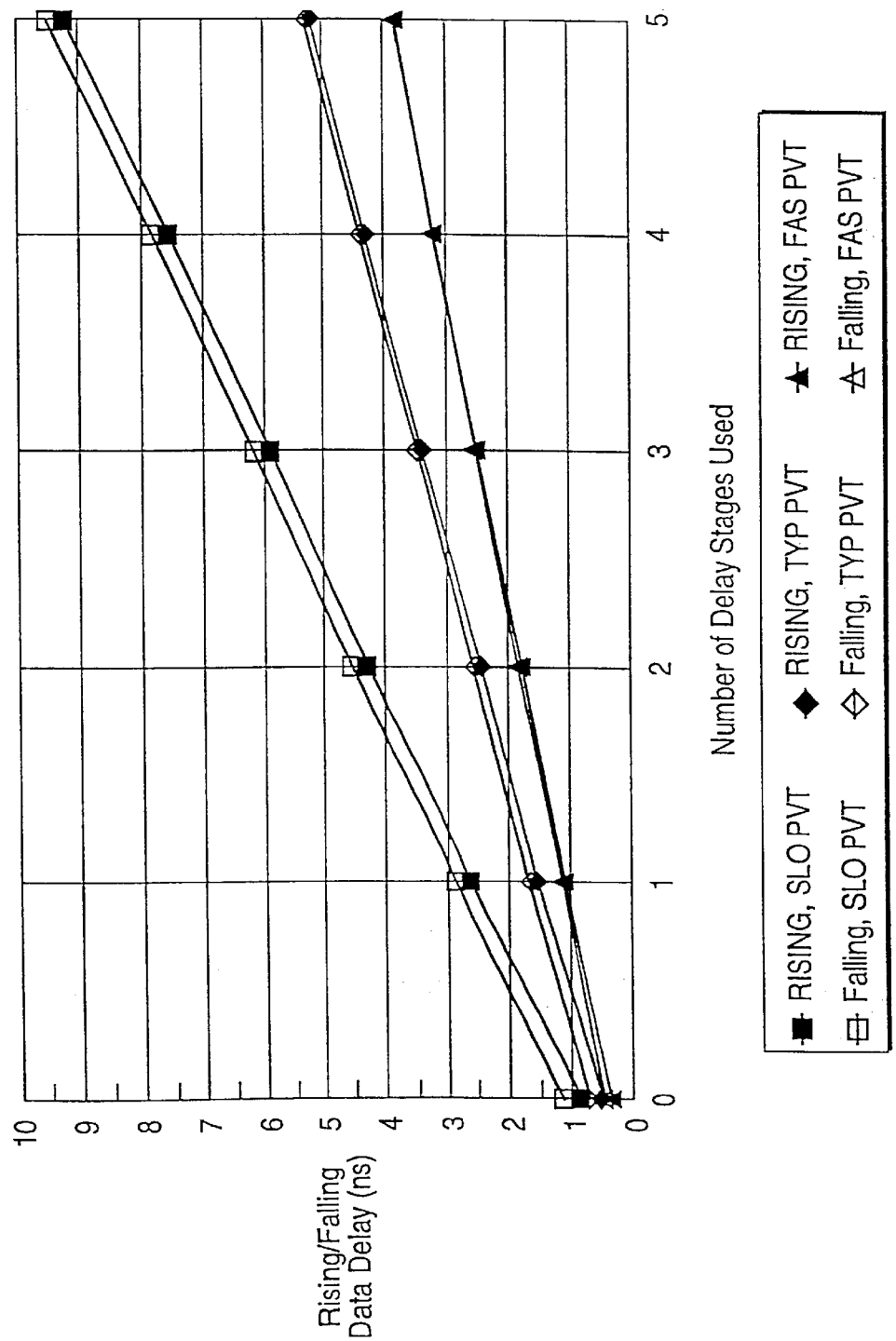

FIG. 12 is a graph illustrating an example of the rising and falling data delay which can be obtained from a 'typical' data delay circuit utilizing the present invention.

5.0 DESCRIPTION OF THE PRESENT INVENTION

FIG. 9 shows a circuit diagram which illustrates a portion of an integrated circuit 1100 in accordance with the present invention. As described in greater detail below, the present invention provides an increased data delay by employing a series of delay stages, each of which provides a small data delay with fast rise and fall times, over all PVT conditions.

As shown in FIG. 9, circuit 1100 includes a zero hold time input data cell 1110 which contains a data pin 1112 that is connected to receive a data signal DATA from an external data bus. Data pin 1112, in turn, drives the input terminal of an input data buffer 1114. The output terminal of data buffer 1114 drives the input terminal, A, of a programmable delay circuit 1116. If optional delay latch 1118 is present, one of the outputs from delay circuit 1116 will drive the D input terminal of optional delay latch 1118. If optional delay latch 1118 is not present, one of the outputs from programmable delay circuit 1116 will directly drive the D input of a flop located in the core, such as flop 1130.

Figure 1:
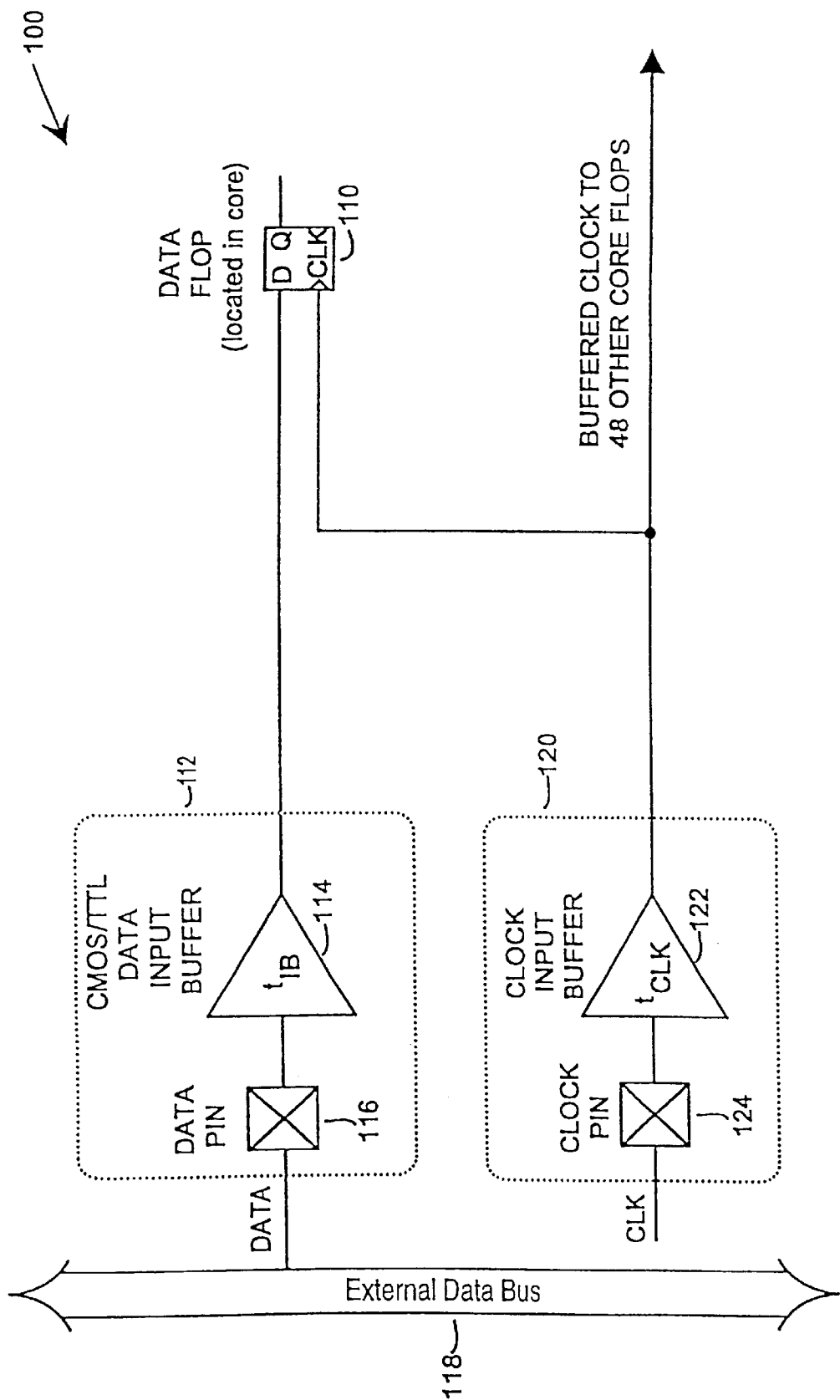
FIG. 1 is a circuit diagram illustrating a portion of a conventional integrated circuit 100.
Figure 2A:
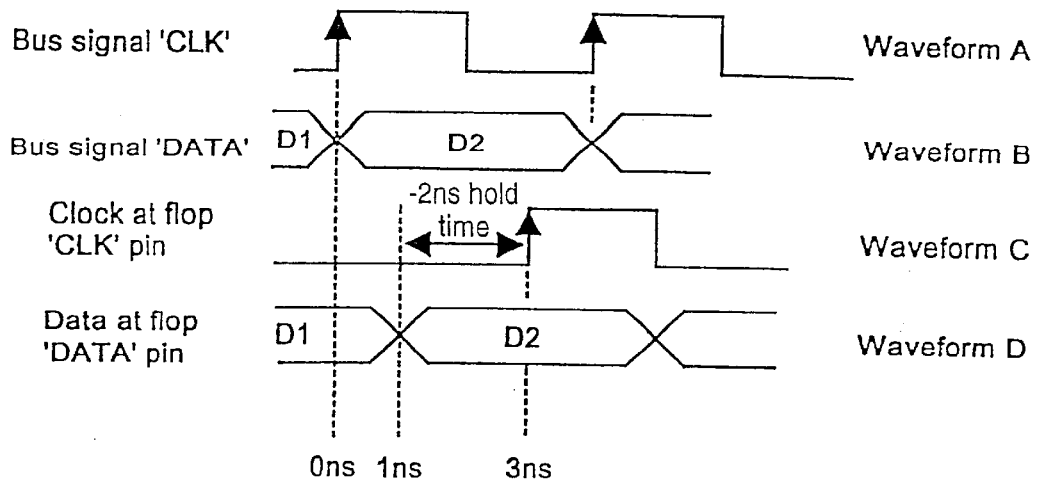
FIGS. 2A and 2B are timing diagrams illustrating the hold time problem with respect to FIG. 1.
Figure 2B:
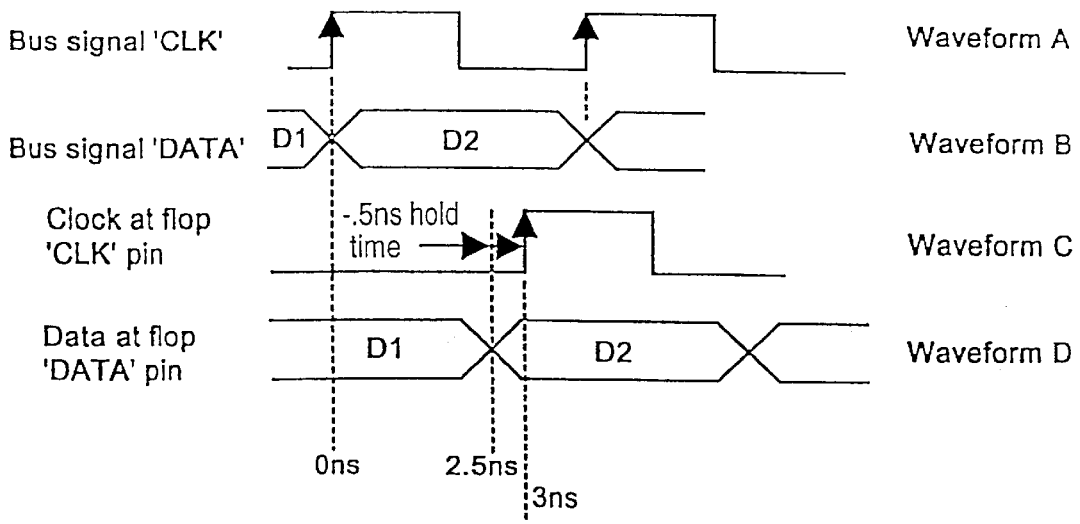
Figure 3:
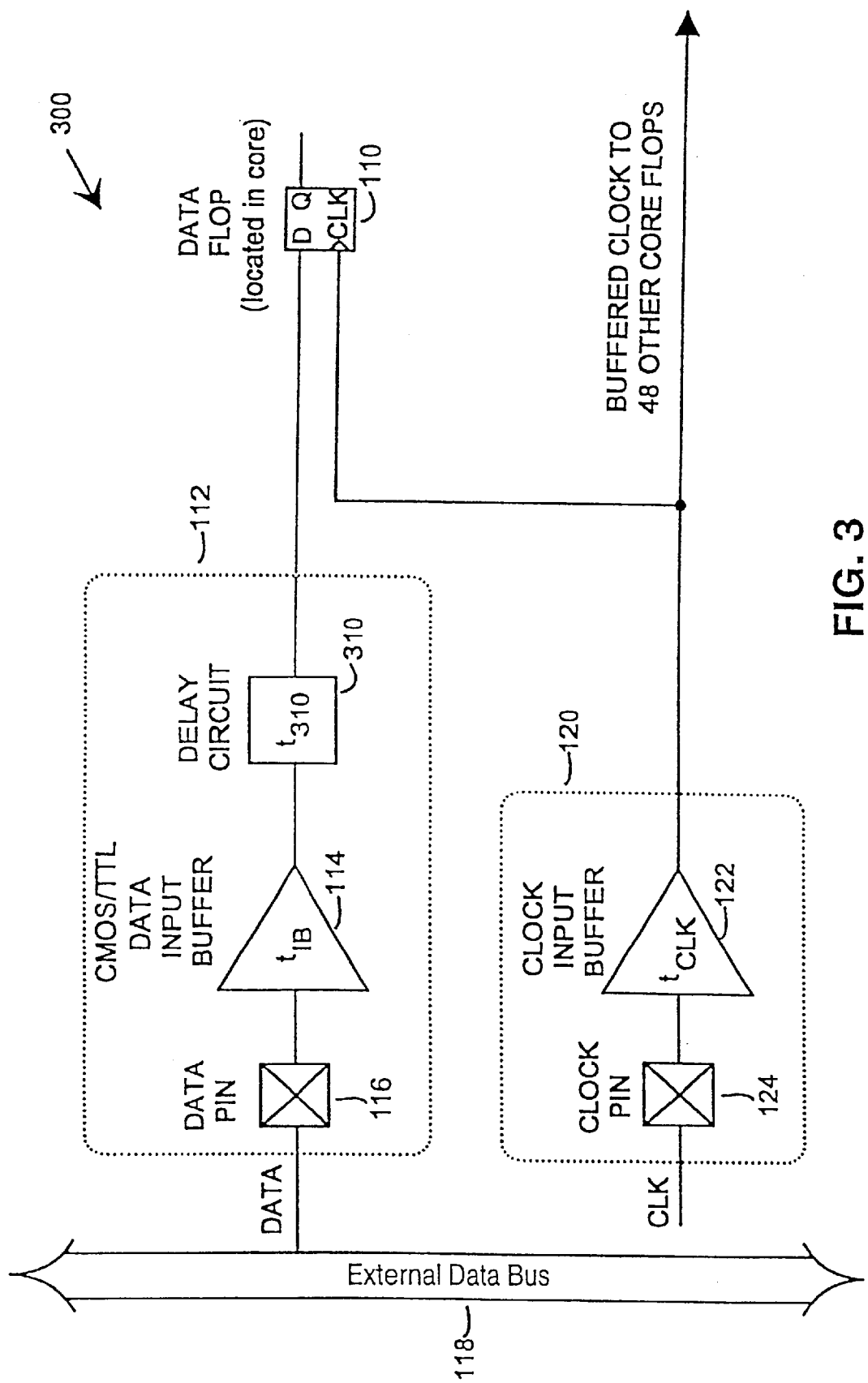
FIG. 3 is a circuit diagram illustrating a portion of a conventional integrated circuit 300.
Figure 4:
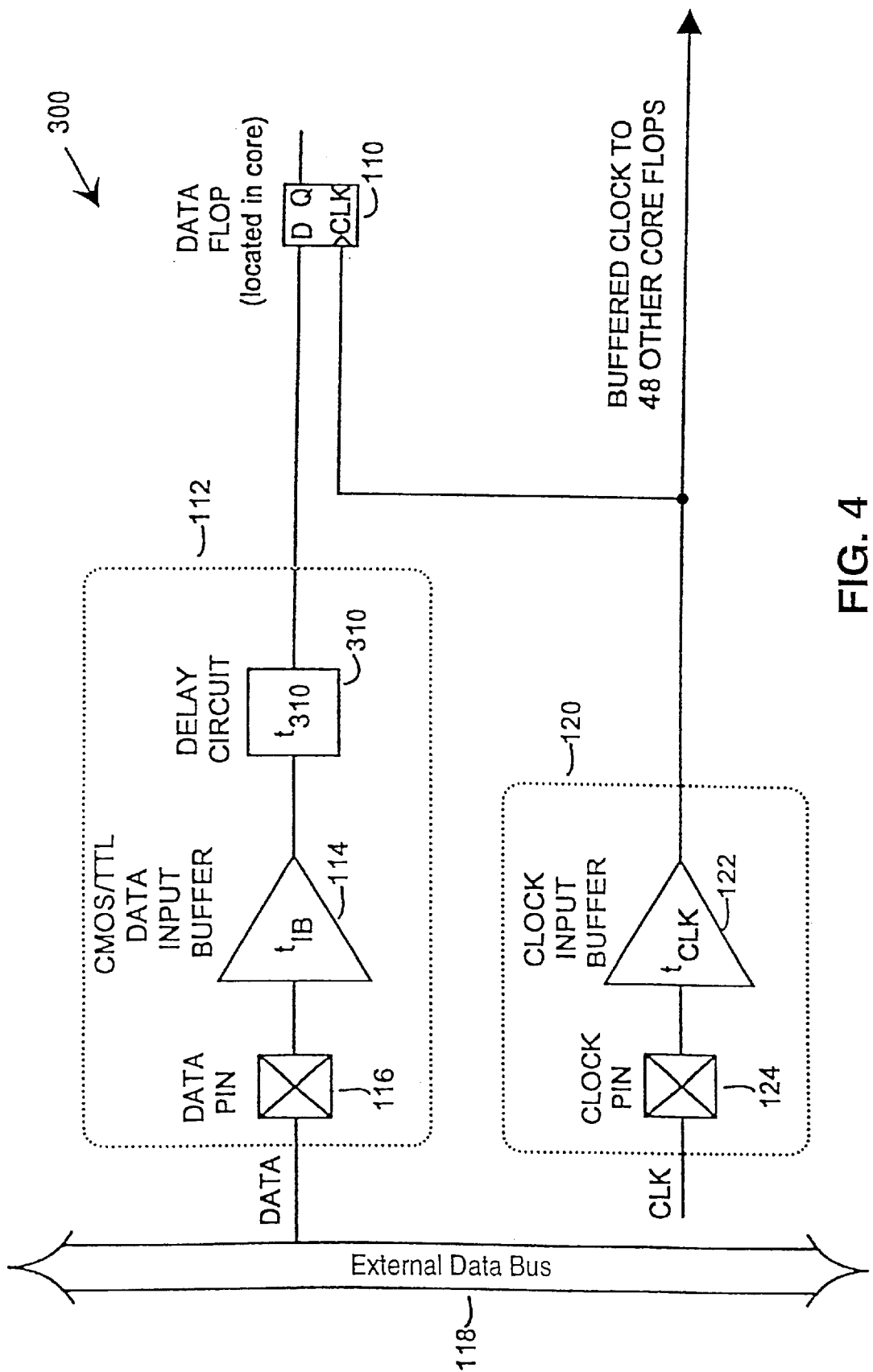
FIG. 4 is a circuit diagram illustrating a portion of an integrated circuit 400.
Figure 5:
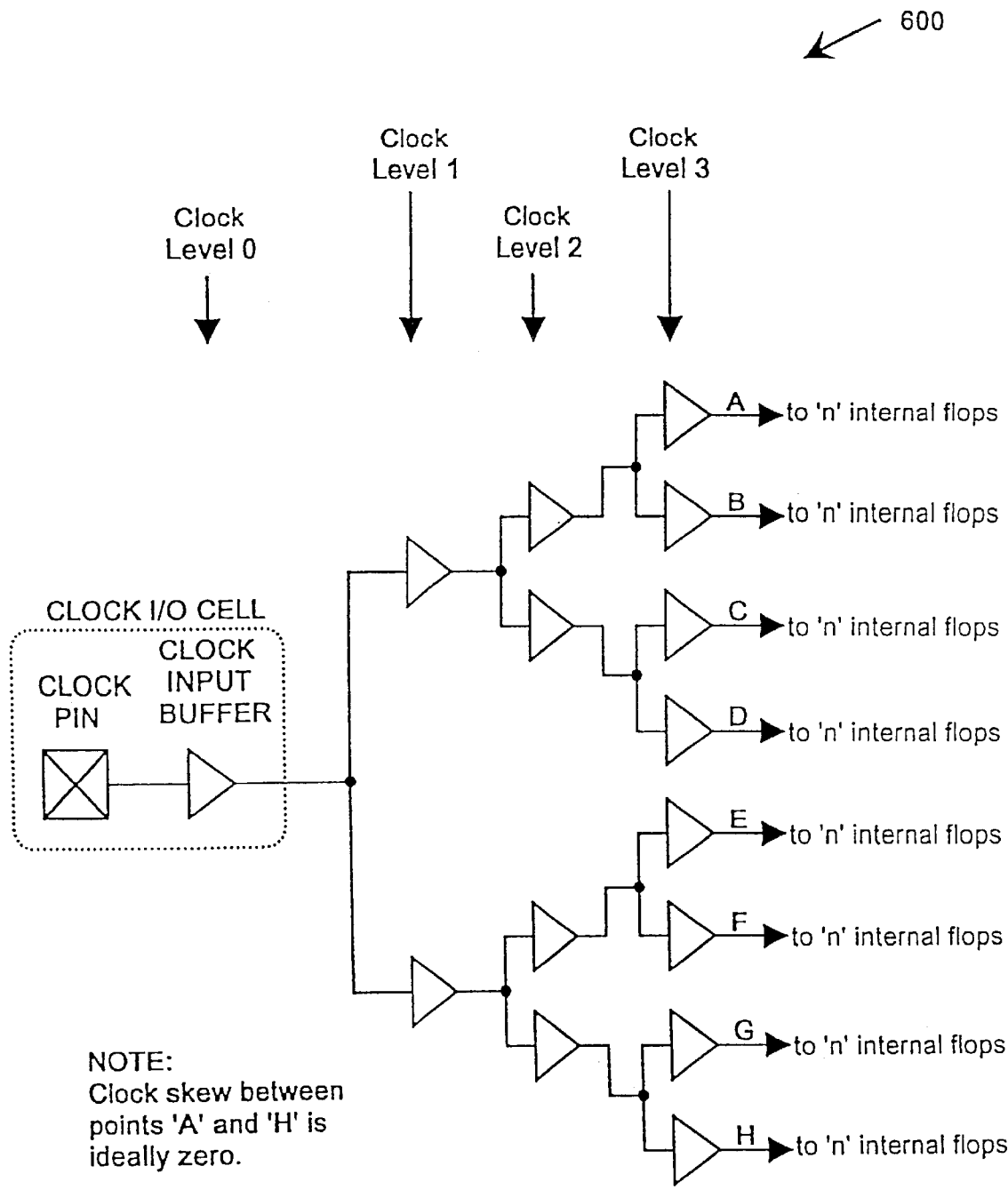
FIG. 5 is a schematic diagram illustrating a multi-stage, hierarchical clock tree 600.
Figure 6:
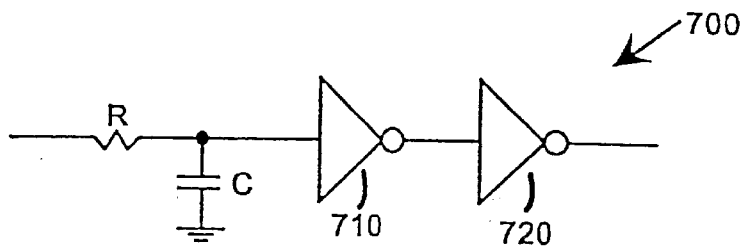
FIG. 6 is a circuit diagram illustrating a conventional RC delay stage 700 that can be used t o implement delay circuit 310.
Figure 7:
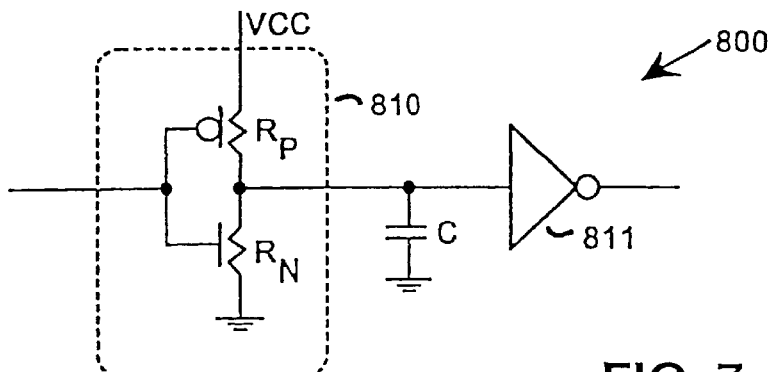
FIG. 7 is a circuit diagram illustrating another conventional delay stage 800 that can be used to implement delay circuit 310.

As shown in FIG. 9, circuit 1100 also includes a clock cell 1120 which contains a clock pin 1122 that is connected to receive an external clock signal CLK. Clock pin 1122, in turn, drives the input terminal of clock circuit 1124. As further shown in FIG. 9, the output terminal from clock circuit 1124 drives the control input of optional data latch 1118 (if this component is present), the CLK pin of data flop 1130 (located in the core), and the CLK inputs of other data flops located in the core. Clock circuit 1124 may be implemented as a single clock buffer, such as buffer 122 shown FIG. 4, or as a hierarchical clock tree, such as clock tree 600 shown in FIG. 5.

In accordance with the present invention, programmable delay circuit 1116 in FIG. 9 contains an input A, and a series of serially-connected delay stages DS1–DSn. Delay stages DS1–DSn, in turn, output a corresponding series of delayed signals DA1–DAn, which change logic states at different times after the logic state of input signal A changes state.

FIG. 10A is a circuit diagram of a delay stage DS in accordance with the present invention. As shown in FIG. 10A, stage DS, which is non-inverting, includes a first inverter 1210, a small load capacitance, and a second inverter 1230. The small load capacitance can be implemented by employing a p-channel transistor 1220 as shown in FIG. 10A, or by employing an n-channel transistor 1221 as shown in FIG. 10B.

During normal operation, each delay stage DS generates the same small amount of data delay. Thus the cascaded delay stages DS1–DSn in FIG. 9 comprise a uniform data delay line which has output taps DA1–DAn. As shown in FIG. 9, the required amount of data delay can be obtained by simply making a connection to the appropriate delay line tap (output) DA1–DAn. In the special case where no data delay is required, connection can be made directly to the delay line input A, completely bypassing all stages of the delay line.

When additional delay is needed, it can be obtained by simply tapping (i.e. connecting to) the output from a later stage in the delay line. Conversely, if less delay is needed, it can be obtained by simply tapping the output of an earlier stage in the delay line. Thus, as shown in FIG. 9, optional delay latch 1118 is connected to the last delay stage DSn via output Dan. Of course optional delay latch 1118 could be alternately connected to receive the input signal A, or any of the delayed output signals DA1–DA4 (as shown by the dashed lines in FIG. 9).

FIG. 11 shows a top level view (symbol) which illustrates an I/O cell 1300 in accordance with the present invention. It is assumed, in FIG. 11, that optional data latch 1118, shown inside input data cell 1110 in FIG. 9, has been included inside I/O cell 1300. Thus the LD pin on I/O cell 1300 corresponds to the D pin of data latch 1118 in FIG. 9. Similarly, the DA1–DAn pins on I/O cell 1300 correspond to the delay line output pins, DA1–DAn, on delay circuit 1116 in FIG. 9. Likewise, pin A on I/O cell 1300 corresponds to the delay line input pin A on delay circuit 1116 in FIG. 9.

As indicated in FIG. 11, the desired amount of data delay can be programmed by simply changing how connections are made to the pins LD, A, and DA1–DAn. These pins are located on the top (core) side of I/O cell 1300. Since all of these pins are located on the same metal layer, delay values can be changed quickly and inexpensively, requiring a change to only one mask.

Referring to FIG. 11, delay programming is accomplished by simply connecting one delay output pin, DA, from the plurality of delay output pins, DA1–DAn, to the LD input pin on I/O cell 1300. Alternatively, in the special case where no data delay is required, pin A on I/O cell 1300 would be connected to input pin LD on I/O cell 1300.

If the data delay programmed on the initial silicon was too low, resulting in inadequate hold time, the delay value can be quickly and inexpensively increased by making simple edits to only a single metal mask layer. This is vastly superior to the prior art, which usually requires the addition of data delay inverters at various locations within the core (requiring an all-layer mask change). Even if these extra data delay inverters were included in the initial silicon, re-wiring their connections could easily prove to be a rather daunting task, requiring mask changes to several metal layers and several contact/via layers.

As described in the preceding paragraphs, an important advantage of the present invention is that the output rise/fall times of each data delay stage DS can be made extremely fast, even under slow PVT conditions. Thus moderate to large data delays can be easily generated, while still maintaining fast edge rates in all data delay stages. As a result, the data delay limitation associated with the prior art is completely eliminated.

The fast rise/fall times from delay circuit 1116 in FIG. 9 offer an additional advantage: they tend to speed up the signal path from data input pad 1112 to the D input pin of data flop 1130. This, in turn, allows higher speed data transfers.

Referring to FIG. 9, another advantage of the present invention is that delay circuit 1116 provides delay times which closely track PVT variations. Thus, under fast PVT conditions, the added delay will be reduced, which is exactly what is needed. Conversely, under slow PVT conditions, the added delay will be increased, which is exactly what is needed. In all cases the edge rates will remain sharp and crisp.

5.1 Delay Circuit Example

FIG. 12 shows a graph illustrating the rising/falling data delay which can be obtained from a 'typical' data delay circuit utilizing the present invention. As shown in FIG. 12, the rising/falling data delay is plotted as a function of the number of data delay stages used. The curves in FIG. 12 assume that input A to delay circuit 1116 in FIG. 9 is being driven from a fast data bus and a fast data input buffer, whose rise/fall times are only 0.1 ns.

Since the curves plotted in FIG. 12 are straight lines, it is obvious that the rising and falling data delay per stage is constant (approximately 0.8 ns per stage at fast PVT, and 1.9 ns per stage at slow PVT).

As shown in FIG. 12, the minimum data delay for the entire delay circuit was set at approximately 4 ns at fast PVT. Thus the maximum data delay for the entire delay circuit becomes approximately 9 ns at slow PVT. This 2.3 to 1 delay variation is exactly what is required in order to guarantee zero hold time under all PVT conditions. Of course the number of delay stages, and the delay per stage, can be easily varied to suit a wide variety of data bus timing constraints.

It should be understood that various alternatives to the embodiment of the invention described herein may be employed in practicing the invention. Thus, it is intended that the following claims define the scope of the invention, and that methods and structures within the scope of these claims and their equivalents be covered thereby.

What is claimed is:

1. A zero hold time input data cell comprising:
   an input pad;
   an input buffer circuit connected to the input pad that receives an input data signal from the input pad;
   a circuit element; and
   a delay circuit connected to the input buffer circuit, the delay circuit having a plurality of delay stages, the plurality of delay stages having a plurality of outputs such that each delay stage has an output that is connectable to the circuit element, none of the outputs being connected together.

2. The cell of claim 1 wherein the input buffer is non-inverting.

3. The cell of claim 1 wherein the input buffer is inverting.

4. The cell of claim 3 and further comprising an inverter connected to the delay circuit.

5. The cell of claim 1 wherein each delay stage includes:
   a first inverter;
   a second inverter connected to the first inverter; and
   a capacitive load connected to the first inverter.

6. The cell of claim 5 wherein the capacitive load includes a transistor.

7. The circuit of claim 1 wherein each delay stage provides a delay, and wherein the delay provided by each delay stage is substantially constant.

8. The circuit of claim 7 wherein the delay provided by each stage has a first delay when process, voltage, and temperature conditions have a first value, and a second delay when process, voltage, and temperature conditions have a second value that is greater than the first value, the first delay being greater than the second delay.

9. An integrated circuit comprising:
   a zero hold time input data cell having:
      an input data pad;
      an input buffer circuit connected to the input data pad that receives an input data signal from the input data pad;
      a delay latch;
      a delay circuit connected to the input buffer circuit, the delay circuit having a plurality of delay stages, the plurality of delay stages having a plurality of outputs such that each delay stage has an output that is connectable to the delay latch, none of the outputs being connected together; and a clock input cell having:
   a clock pad;
   an input clock circuit connected to the clock pad and the delay latch; and
   a data flip flop connected to the delay latch and the input clock circuit.

10. The circuit of claim 9 wherein the input buffer is non-inverting.

11. The circuit of claim 9 wherein the input buffer is inverting.

12. The circuit of claim 11 further comprising an inverter connected to the delay circuit.

13. The circuit of claim 9 wherein each delay stage includes:
   a first inverter;
   a second inverter connected to the first inverter; and
   a capacitive load connected to the first inverter.

14. The circuit of claim 9 wherein the input clock circuit includes a hierarchical clock tree.

15. A method for programming a delay into a data input cell having:
   an input pad;
   an input buffer circuit connected to the input pad that receives an input data signal from the input pad;
   a circuit element having a data input pin; and
   a delay circuit connected to the input buffer circuit, the delay circuit having a plurality of delay stages, the plurality of delay stages having a corresponding plurality of delayed output pins such that each delay stage has a delayed output pin that is connectable to the circuit element, none of the output pins being connected together; and
   the method comprising the steps of:
   selecting a delayed output pin from the plurality of delayed output pins to be a selected output pin; and
   connecting the selected output pin to the data input pin.

16. A method for forming a zero hold time data input cell, the method comprising the steps of:
   forming an input pad;
   forming an input buffer circuit connected to the input pad to receive an input data signal from the input pad;
   forming a circuit element; and
   forming a delay circuit connected to the input buffer circuit, the delay circuit having a plurality of delay stages, the plurality of delay stages having a plurality of outputs such that each delay stage has an output that is connectable to the circuit element, none of the outputs being connected together.

17. A zero hold time input data cell comprising:
   an input pad;
   an input buffer circuit connected to the input pad that receives an input data signal from the input pad;
   a circuit element; and
   a delay circuit connected to the input buffer circuit, the delay circuit having a plurality of delay stages, the plurality of delay stages having a plurality of outputs such that each delay stage has an output that is connectable to the circuit element, none of the outputs being connected together, each delay stage providing a delay, the delay provided by each delay stage being substantially constant, the delay provided by each delay stage having a first delay when process, temperature, and voltage conditions have a first value, and a second delay when process, temperature, and voltage conditions have a second value that is greater than the first value, the first delay being greater than the second delay, the first delay being approximately 2.3 times greater than the second delay.

18. A zero hold time input data cell comprising:
   an input pad;
   an input buffer circuit connected to the input pad that receives an input data signal from the input pad;
   a circuit element, the circuit element being a latch having a data input and a latching input, the latching input being responsive to a falling edge; and
   a delay circuit connected to the input buffer circuit, the delay circuit having a plurality of delay stages, the plurality of delay stages having a plurality of outputs such that each delay stage has an outfit that is connectable to the circuit element, none of the outputs being connected together.

19. A zero hold time input data cell comprising:
   an input pad;
   an input buffer circuit connected to the input pad that receives an input data signal from the input pad;
   a circuit element, the circuit element being a flip flop having a data input and a clock input that receives a clock signal, the clock input being responsive to a rising edge of the clock signal; and
   a delay circuit connected to the input buffer circuit, the delay circuit having a plurality of delay stages, the plurality of delay stages having a plurality of outputs such that each delay stage has an output that is connectable to the circuit element, none of the outputs being connected together.

20. A zero hold time input data cell comprising:
   an input pad;
   an input buffer circuit connected to the input pad that receives an input data signal from the input pad;
   a circuit element, the circuit element being a latch having a data input, a clock input that receives a clock signal, and a data output, the clock input being responsive to a falling edge of the clock signal, and further comprising a flip flop having a data input connected to the data output and a clock input that receives the clock signal, the clock input of the flip flop being responsive to a rising edge of the clock signal; and
   a delay circuit connected to the input buffer circuit, the delay circuit having a plurality of delay stages, the plurality of delay stages having a plurality of outputs such that each delay stage has an output that is connectable to the circuit element, none of the outputs being connected together.

21. An input data cell comprising:
   a circuit element;
   a data pad;
   an input buffer connected to the data pad and a buffered node;
   a programmable delay circuit connected to the buffered node, the programmable delay circuit having a plurality of delay stages, the plurality of delay stages having a plurality of output nodes such that each delay stage has an output node, each output node being connectable to the circuit element.

22. The input data cell of claim 21 wherein each delay stage has an input node and an output node such that, except for a first delay stage, the input node of each stage is connected to the output node of a preceding delay stage.

23. The input data cell of claim 21 wherein the buffered node is connectable to the circuit element.

24. The input data cell of claim 21 wherein each data stage includes:

a first inverter having an inverter output;

a second inverter having an inverter input connected to the inverter output of the first inverter; and a capacitive load connected to the inverter output of the first inverter.

25. The input data cell of claim 24 wherein the clock circuit includes a hierarchical clock tree.

26. The input data cell of claim 21 and further comprising:

a clock pad; and a clock circuit connected to the clock pad and the circuit element.

27. An input data cell comprising:

a data pad;

an input buffer connected to the data pad and a buffered node;

a programmable delay circuit connected to the buffered node, the programmable delay circuit having a plurality of delay stages, each delay stage having an input node and an output node such that, except for a first delay stage, the input node of each stage is connected to the output node of a preceding delay stage; and a circuit element connected to an output node.

28. The input data cell of claim 27 wherein each data stage includes:

a first inverter having an inverter output;

a second inverter having an inverter input connected to the inverter output of the first inverter; and a capacitive load connected to the inverter output of the first inverter.

29. The input data cell of claim 27 and further comprising:

a clock pad; and a clock circuit connected to, the clock pad and the circuit element.

30. The input data cell of claim 29 wherein the clock circuit includes a hierarchical clock tree.

* * * * *